(12) United States Patent
Johnston (10) Patent No.: US 9,226,410 B2
(45) Date of Patent: Dec. 29, 2015

(54) METHOD OF MAKING A FLEXIBLE CIRCUIT

(71) Applicant: Trackwise Designs Limited, Tewkesbury, Gloucestershire (GB)

(72) Inventor: Philip Johnston, Cheltenham (GB)

(73) Assignee: TRACKWISE DESIGNS LIMITED, Gloucestershire (GB)

( * ) Notice: Subject to any disclaimer, the term of this patent is extended or adjusted under 35 U.S.C. 154(b) by 0 days.

(21) Appl. No.: 14/375,824

(22) PCT Filed: Jan. 24, 2013

(86) PCT No.: PCT/GB2013/050147
§ 371 (c)(1),
(2) Date: Jul. 31, 2014

(87) PCT Pub. No.: WO2013/114080
PCT Pub. Date: Aug. 8, 2013

(65) Prior Publication Data
US 2015/0108084 A1 Apr. 23, 2015

(30) Foreign Application Priority Data

Feb. 2, 2012 (GB) .................................. 1201806.5

(51) Int. Cl.
*H05K 3/46* (2006.01)
*H05K 1/02* (2006.01)
*H05K 1/11* (2006.01)
(Continued)

(52) U.S. Cl.
CPC .......... *H05K 3/4611* (2013.01); *B32B 37/1027* (2013.01); *H05K 1/0298* (2013.01); *H05K 1/115* (2013.01); *H05K 3/06* (2013.01); *H05K 3/064* (2013.01); *H05K 3/4635* (2013.01); *H05K 3/4644* (2013.01); *B32B 2457/08* (2013.01); *H05K 3/462* (2013.01); *H05K 3/4617* (2013.01); *H05K 3/4638* (2013.01); *H05K 2201/09063* (2013.01); *H05K 2203/068* (2013.01); *H05K 2203/1545* (2013.01); *H05K 2203/167* (2013.01)

(58) Field of Classification Search
CPC .... B32B 15/08; B32B 7/12; B32B 2255/806; H05K 1/0298; H05K 3/4644; H05K 1/115; H05K 1/0306; H05K 3/4611
See application file for complete search history.

(56) References Cited

U.S. PATENT DOCUMENTS 4,052,603 A * 10/1977 Karlson ........................ 700/192
4,579,612 A 4/1986 Held
(Continued)

FOREIGN PATENT DOCUMENTS

EP 0291629 A2 11/1988
EP 0327838 A2 8/1989
(Continued)

*Primary Examiner* — Duy Deo
(74) *Attorney, Agent, or Firm* — Hodgson Russ LLP (57) ABSTRACT

A method of manufacturing a multilayer flexible circuit comprises providing first and second flexible substrates, each comprising a conductor layer and an insulator layer. The conductor layer of the first substrate is a patterned conductor layer. The first and second substrates are laminated together using a double belt press through which the substrates move in a continuous process. The method may include patterning the conductor layer of the first substrate and/or the conductor layer of the second substrate using an etching method that includes exposing a dry film resist on the conductor layer to a pattern by carrying out a plurality of exposures of adjacent and/or overlapping areas.

34 Claims, 7 Drawing Sheets

(51) Int. Cl.
  *B32B 37/10* (2006.01)
  *H05K 3/06* (2006.01)

(56) References Cited

U.S. PATENT DOCUMENTS

| | | |
|---|---|---|
| 4,599,128 A | 7/1986 | Held |
| 4,659,425 A | 4/1987 | Eggers et al. |
| 4,670,080 A | 6/1987 | Schwarz et al. |
| 5,729,897 A * | 3/1998 | Schmidt et al. ............... 29/852 |
| 6,015,607 A | 1/2000 | Fraivillig |
| 2001/0018796 A1 | 9/2001 | Lee et al. |
| 2004/0099374 A1 * | 5/2004 | Kanakarajan ............... 156/345.1 |
| 2006/0240364 A1 | 10/2006 | Lauffer et al. |
| 2011/0005812 A1 * | 1/2011 | Shimokawa et al. ......... 174/255 |

FOREIGN PATENT DOCUMENTS

| | | |
|---|---|---|
| JP | H09314785 A | 12/1997 |
| WO | 2008150622 A1 | 12/2008 |

* cited by examiner

Figure 1

(h) Apply second substrate and weld in place (i) Laminate together first and second substrate using double belt press (j) Laminate dry film resist (k) Pattern second metal layer

METHOD OF MAKING A FLEXIBLE CIRCUIT

FIELD OF THE INVENTION

The present invention relates to a method of making a flexible circuit. More specifically, the present invention relates to a method which is suitable for making multi-layer flexible circuits of arbitrary length.

BACKGROUND

Flexible printed circuit boards (PCBs) are known, and typically comprise a thin, flexible electrically insulating layer (such as polyester, polyimide, thermoplastic), on which is disposed a patterned electrically conducting layer (such as copper). A further protective cover layer may be disposed over the conducting layer to protect it, the cover layer having apertures to provide electrical access to the conducting layer.

Single sided PCBs, with a single conducting layer on a single side of a flexible insulating layer, may be made by: laminating together a copper and polyimide layer; depositing a resist coating over the copper layer; patterning the resist layer by a lithographic process; etching the copper layer; stripping the resist and applying the cover layer. Holes may be created in the flexible insulating layer and/or through all the layers of the flexible PCB.

Lamination of the conducting and insulating layer may be carried out prior to patterning the layers, by feeding continuous, un-patterned sheets of the conductor and insulator into a nip roller press, which provides heat and pressure to the adhesive therebetween to bond the conductor and insulator together.

Double sided flexible PCBs are known, in which a conducting layer is provided on both sides of a flexible insulating layer. In order to make double-sided flexible PCBs, continuous un-patterned sheets are first laminated together to form a conductor-insulator-conductor layer structure. The conducting layer on both sides is subsequently patterned by carrying out the patterning process outlined above on both sides of the flexible PCB. Conducting vias may be created to provide electrical connections between the two conducting layers.

Multi-layer PCBs may be formed by laminating together single sided or double sided flexible PCBs using a static press. Such multi-layer PCBs therefore comprise at least two conducting layers and at least two flexible insulating layers.

Relative to laminating un-patterned blanket layers, which may be achieved using a continuous process, laminating multiple flexible PCBs (each with patterned conducting layers) is demanding, and typically requires greater duration under heat and pressure. Lamination of multi-layer PCBs is therefore typically undertaken using a static press, and typical curing cycles using an appropriate adhesive may be in excess of an hour. The size of the static press used in such a long duration lamination presently limits the maximum size of multi-layer flexible PCBs.

Flexible PCBs may be used as replacements for wiring harnesses. In many such applications, multi-layer flexible PCBs are desirable, for instance due to their potential to provide shielding from electromagnetic interference, and/or to provide a greater density of conducting tracks by stacking. Some aerospace applications require that the total harness length is longer than can typically be accommodated by a flat press. Although several multi-layer flexible PCBs may be connected in series, the connectors form potential failure points, and may be problematic.

The present applicant has identified that nip roller presses are not suitable for laminating together the component layers of multilayer flexible PCBs. The circuit pattern results in varying layer thickness across the width (perpendicular to the direction of movement in a roller press) and along the length (parallel to the direction of movement in the roller press). As nip rollers apply a line force which is related to thickness, rather than a fixed pressure, this variation of thickness results in a variation of line force and a tendency to disturb the layers being bonded, resulting in misalignment and/or layer creasing.

WO 2008/150622 discloses a method of making a multilayer flexible circuit of arbitrary length by using a continuous lamination process to combine a plurality of insulating layers with a plurality of conducting layers. WO 2008/150622 teaches a method of combining self supporting alternating layers of insulating and conducting material by extending them from a roll, and laminating them together, wherein through holes in the layers are used to maintain alignment therebetween. WO 2008/150622 is silent on the lamination process by which the layers are combined, and does not disclose a process which is suitable for combining multiple patterned layers. Furthermore, the method of WO 2008/150622 is not suitable for use with layers that comprise multiple separate (i.e. disconnected) regions, since each layer is individually extended from a roll before being combined together. A layer comprising multiple separate regions would therefore fall apart prior to lamination following the teaching of WO 2008/150622.

US 2001/0018796 discloses a method of making a multilayer circuit structure in which two circuit substrates are combined by passing them through a nip between a roller element and a body while heat and pressure are applied. The circuit substrates are provided with tooling holes through which tooling pins on the roller element engage, thereby maintaining alignment between the substrates as they are combined. As described above, the present applicant has identified that this type of hot roll lamination process is not suitable for laminating PCBs with topology resulting from patterned conducting layers.

A method of manufacturing multi-layer flexible PCBs of arbitrary length which can accommodate topology arising from discontinuous, irregular and/or patterned conducting layers is therefore desirable.

SUMMARY

In one aspect, a method of manufacturing a multilayer flexible circuit comprises: providing first and second flexible substrates, each comprising a conductor layer and an insulator layer, the conductor layer of the first substrate being a patterned conductor layer; and laminating the first and second substrates together using a double belt press through which the substrates move in a continuous process. The method may include patterning the conductor layer of the first substrate and/or the conductor layer of the second substrate using an etching method that includes exposing a dry film resist on the conductor layer to a pattern by carrying out a plurality of exposures of adjacent and/or overlapping areas.

A double belt press may be considered to be one in which pressure or force is exerted over adjacent regions of two opposed belts, between which material is pressed. The belts may move in synchronicity so that material is conveyed by the belts as it is pressed. Both of the belts may be continuous so that the belts may move continuously to continuously convey and press material therebetween. The double belt press may comprise at least two opposed belts, and may additionally comprise further belts, or further pairs of opposed belts.

The double belt press may include an isobaric region.

The double belt press may include an isochoric region.

The first substrate may be provided with alignment features which are used for subsequent alignment with a further layer or substrate. The alignment features may comprise through holes. The alignment features may be provided at either end of the first substrate. The alignment features may be provided at regular intervals along the length of the substrate.

The method may further comprise the step of aligning the first and second substrates prior to laminating them together. Aligning the substrates may comprise using the alignment features.

The method may comprise the step of fixing together the first and second substrates together prior to laminating them together. Fixing may comprise locally welding the first substrate to the second substrate.

The method may comprise arranging an outer conductor layer with the first and second substrate and subsequently laminating it together with them, to thereby form an outer conductor layer of the flexible circuit.

The method may further comprise the step of patterning a conductor layer by: laminating a dry film resist onto the conductor layer; exposing the resist to a pattern; developing the resist; etching the conductor layer, thereby patterning it in correspondence to the developed resist; and stripping the resist layer.

Exposing may comprise aligning a photomask on the resist layer. A plurality of overlapping and/or adjacent photomasks may be aligned on the resist layer. Exposing may comprise carrying out a plurality of exposures over adjacent areas of the resist layer.

Exposing may comprise using laser direct imaging. The method may comprise moving the substrate under a stationary laser direct imaging device to expose the resist in a continuous process.

The substrate may be moved in a stepwise manner under a laser direct imaging device to expose the resist. The laser direct imaging device may be moved over a stationary substrate.

Alignment features may be patterned in the conductor layer. The alignment features in the conductor layer may be used in aligning patterning of a subsequent conductor layer.

The patterned conductor layer may comprise a plurality of separate (electrically disconnected) regions of conductor. The patterned conductor layer may not be self supporting. The patterned conductor layer may be discontinuous. The patterning of the conductor layer may be irregular. The patterned conductor layer may be arranged to form a circuit.

Each part of the substrate may be subjected to a predetermined cycle of heat and pressure during lamination. The cycle may have a duration of at least 10 minutes. The cycle may have a duration of at least 1 hour.

The press may comprise a plurality of regions, each region imparting a predetermined temperature and/or pressure to the substrate during lamination. A central region of the press may impart a temperature and pressure that is higher than that imparted by region adjacent to the entrance of the press, and/or higher than that imparted by a region adjacent to the exit of the press.

The conductor layer of the second substrate may be patterned prior to laminating together the first and second substrate.

The conductor layer of the second substrate may be patterned after laminating the first and second substrate together. The outer conductor layer may be patterned after laminating together the first and second substrate. The first and/or second substrate may comprise a plurality of conducting layers. The first and/or second substrate may comprise double sided substrates, each double sided substrate comprising a first and second conducting layer, with an insulating layer therebetween. At least three substrates may be laminated together, so that the method would comprise laminating a third and optionally additional such substrates together with the first and second substrates.

A bondfilm may be disposed between adjacent substrates and/or layers before laminating them together.

The outer conductor layer may be patterned after it is laminated together with the first and second substrate.

The term "continuous process" is intended to include a process in which the first and second substrates are held stationary in the press for a predetermined time as part of the continuous process.

In another aspect, a method of manufacturing a multilayer flexible circuit, comprises: providing first and second flexible substrates, each comprising a conductor layer and an insulator layer, the conductor layer of the first substrate being a patterned conductor layer; fixing together the first and second substrates; laminating the first and second substrates together using a double belt press through which the substrates move in a continuous process; and patterning the conductor layer of the first substrate and/or the conductor layer of the second substrate by: laminating a dry film resist onto the conductor layer; exposing the resist to a pattern, wherein exposing comprises carrying out a plurality of exposures over adjacent areas of the resist layer; developing the resist; etching the conductor layer, thereby patterning it in correspondence to the developed resist; and stripping the resist layer.

A process is proposed for the production of multilayer flexible printed circuit boards of arbitrary length comprising the following steps:

within a limited area: depositing and/or patterning a metal layer on an insulator layer by conventional means and creating alignment features;

stepping and repeating the depositing/patterning operation, aligning the patterning operation using the alignment features to form a patterned component layer (substrate) of arbitrary length;

repeating the stepped depositing/patterning operation to form a plurality of component layers (substrates) of arbitrary length;

aligning the component layers (substrates) using the alignment features;

using a continuous lamination process (e.g. using an isobaric press) to laminate together the component layers (substrates), thereby forming a multi-layer flexible PCB of arbitrary length.

The component layers may include patterned metal layers on both sides of the insulator. The stepping and repeating process may comprise overlapping the limited area of deposition and/or patterning. The alignment features may through holes.

Using the alignment features may comprise overlaying alignment features and fixing and/or riveting through them to secure layers in the proper relative alignment. Stress relief features may be included in the component layers.

DETAILED DESCRIPTION

Figure 1:
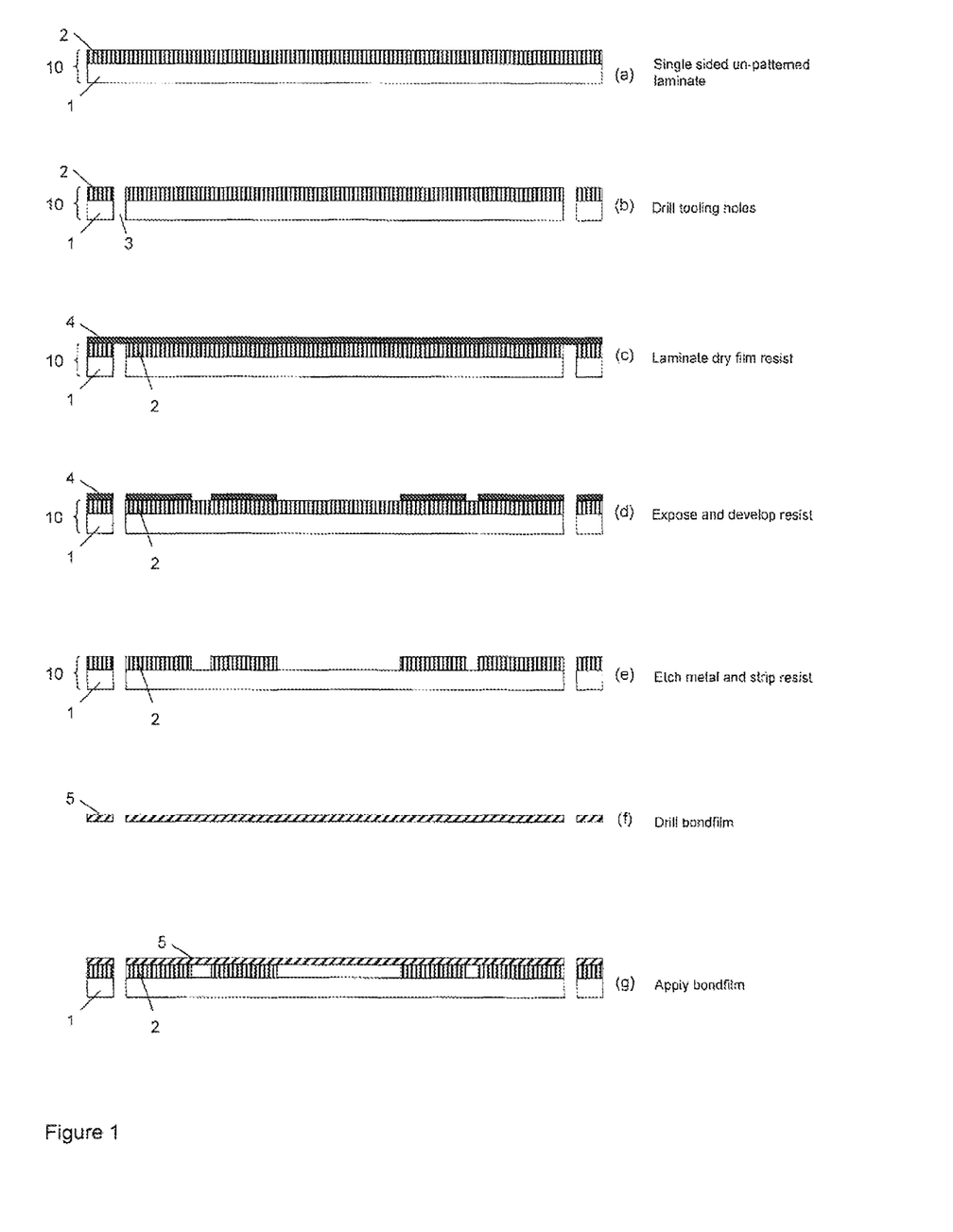
FIG. 1 shows a first subset of process steps (a) to (g) according to a first embodiment of the invention.
Figure 2:
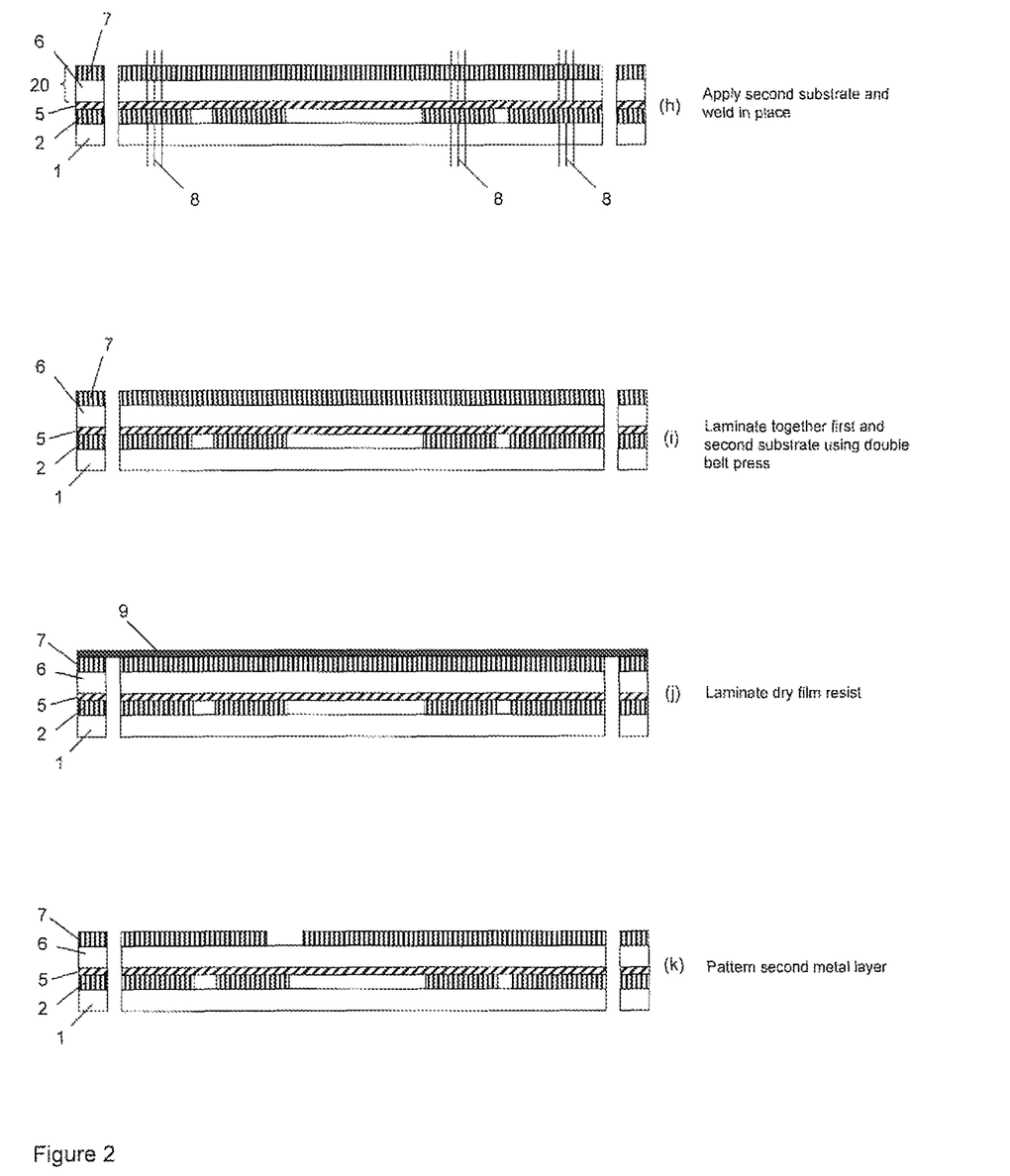
FIG. 2 shows a second subset of process steps (h) to (k) according to a first embodiment of the invention.
Figure 3:
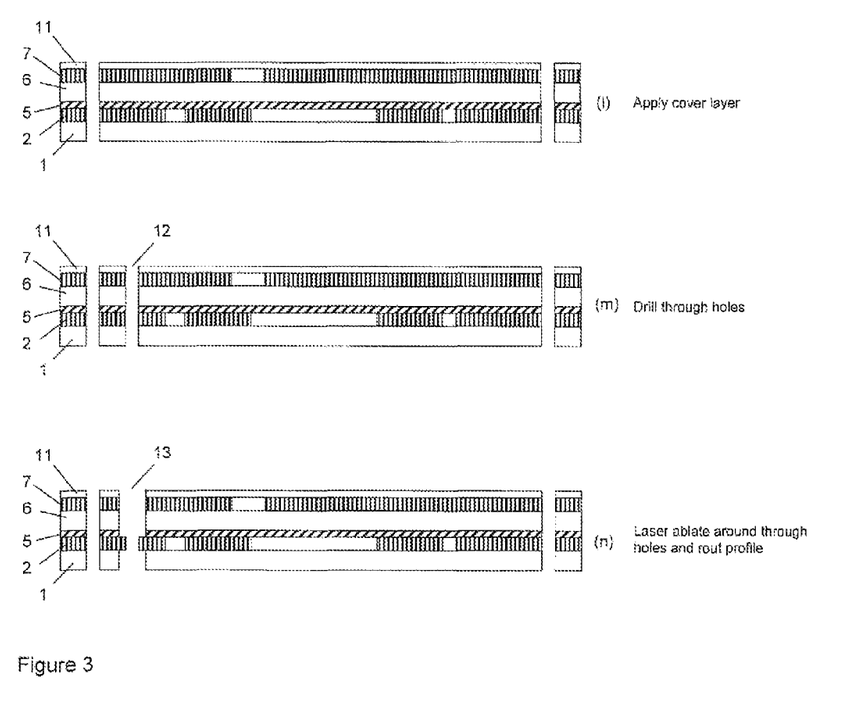
FIG. 3 shows a third subset of process steps (l) to (n) according to a first embodiment of the invention.

According to a first embodiment, a process by which multilayer flexible PCBs of arbitrary length may be produced is summarised by the following process steps (a) to (k), which will be described with reference to FIGS. 1 to 3.

It will be appreciated that, for simplicity, FIGS. 1 to 8 do not illustrate the topology resulting from lamination of first and second substrates 10, 20 instead representing each layer as planar. For example, in practice the bondfilm 5 introduced below will partially reflow to partially planarise the topology of the patterned conductor layer and layers overlying topology will curve to accommodate it; this is not represented in the drawings for simplicity.

The process according to a first embodiment begins (a) with a first pre-laminated substrate 10 of the appropriate length comprising an un-patterned, continuous metal conductor layer 2 on a continuous, un-patterned insulator layer 1. Such substrates 10 are well known to the skilled person, and are essentially unlimited in length, being produced by a continuous process. By way of example, the process will be described with reference to a substrate 10 of arbitrary length.

In the next step (b) alignment holes 3 are drilled in substrate 10, which are used for alignment of subsequent process steps. The first substrate 10 is subsequently cleaned using a horizontal continuous, conveyorised process which is suitable for any length of substrate 10.

In step (c), dry film photosensitive resist 4 is laminated onto the metal layer 2 using a horizontal continuous, conveyorised process, which can accommodate any length of substrate 10. The resist 4 is subsequently patterned by exposing it to a pattern of light, and developing the resist (step (d)).

One method of exposing the resist layer 4 is to use a photomask to selectively block a flood light source directed at the resist. The photomask may be a transparent film with an opaque printed pattern layer placed in contact with the resist layer during exposure.

Obtaining very long photomasks can be problematic, their maximum length typically being limited, for instance to less than 3 meters. Patterning resist layers on long substrates may be achieved, according to an embodiment of the invention illustrated by FIG. 7, by arranging a plurality of overlapping or adjacent photomasks 14, 15, which are aligned to each other and the underlying substrate. In the present case, a first photomask 14 and second photomask 15 may be provided, each with features that correspond to the alignment holes 3 in the substrate 10. The first photomask 14 may be aligned using the alignment holes 3 in the substrate 10, and the second photomask 15 may be aligned using the alignment holes 3 in the substrate 10. The alignment of the central overlapping region 16 may be checked with reference to the overlapping features of each photomask, and the interface between the photomasks 14, 15 taped together using transparent tape (not shown) to ensure alignment is maintained. The resist 4 may be subsequently exposed by exposing the combined photomask 14, 15 (and subsequently a pattern of resist) to substantially uniform illumination 17 at the appropriate wavelength.

Figure 7:
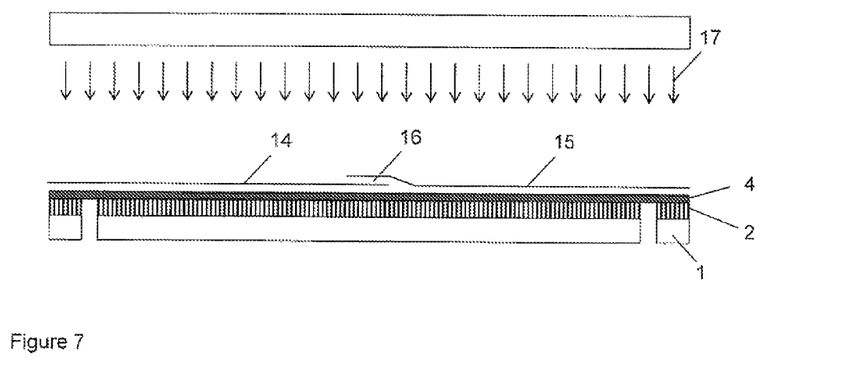
FIG. 7 shows an exposing method according to an embodiment of the invention.

This may be achieved by passing the substrate 10 under a fixed light source, by using a light source with the same area as the substrate 10, or by sequentially exposing different fractional areas of the substrate. In one embodiment, half the resist pattern is exposed in a first operation, and half the resist pattern is exposed in a second operation.

It will be appreciated that combining multiple adjacent photomasks and carrying out continuous or multiple exposures enables a resist layer of unlimited length to be patterned using a plurality of photomasks and an exposure area that are each limited in size.

Alternatively a single photomask, extending over the whole area of the substrate 10, may be arranged in contact with the resist layer 4 prior to exposing the resist.

In a further alternative to exposing through a photomask, the resist 4 may be exposed using a laser direct imaging (LDI) process, in which a laser illuminates the resist 4 in a pattern without the need for a photomask. LDI may be carried out sequentially, in adjacent or overlapping areas by field stitching. Alternatively, LDI of the resist 4 may be carried out using a scanning LDI device under which the substrate 10 is moved in a continuous process, thereby enabling resist layers 4 of arbitrary length to be patterned. The laser direct imaging device may alternatively be moved over the stationary substrate 10 to expose the resist.

Continuous laser direct imaging of the resist may be carried out by moving the substrate under a laser direct imaging device which is stationary in the direction of movement of the substrate at a constant speed. The stationary LDI device may scan the laser across the substrate (perpendicular to the direction of movement of the substrate) as it moves under it. Alternatively, the substrate may be moved under a stationary laser direct imaging device in a stepwise manner. Alignment features in the substrate (for instance holes) may be used during LDI to ensure positional accuracy of the image, both within the area being exposed and in the subsequent alignment of adjacent areas.

The continuous laser direct imaging process may expose the resist on one side only at a time. In such a method the continuous laser direct imaging may mark the circuit with a fiducial or alignment target, that is used for alignment of the imaging of the second side.

Alternatively, the continuous laser direct imaging process may expose the resist on both sides simultaneously.

In the next step (e), the exposed resist 4 is developed, the underlying metal 2 is etched in a corresponding pattern, and the resist 4 is stripped, using a horizontal continuous process (suitable for substrates of arbitrary length).

In step (f), a bondfilm 5 with substantially the same extents as the substrate 10 is drilled or otherwise patterned with through holes corresponding with the alignment holes 3, and is placed in contact with the patterned metal layer 2, (step (g)).

A further substrate 20 is provided of substantially the same size as the first substrate, comprising un-patterned, continuous insulating and metal layers 6, 7. Alignment holes 3 are drilled in the second substrate 20 in correspondence with the alignment holes 3 in the first substrate 10. In step (h) the second substrate 20 is arranged on top of the bondfilm 5, and aligned with the first substrate 10 using the alignment holes 3 and fixed in alignment thereto.

An alignment process in which tooling pins are inserted through the alignment holes 3 of the first and second substrate 10, 20 is used for alignment. Tooling pins may be problematic in subsequent pressing operations, and in order to maintain alignment during pressing without the need for pins in the alignment holes, the first substrate 10 and second substrate 20 are welded together in a plurality of locations prior to pressing. This may be achieved by applying local heat and pressure in each location, thereby reflowing and curing the bondfilm 5 in a each location. The tooling pins may then be removed to prevent them interfering with the pressing process.

Figure 8:
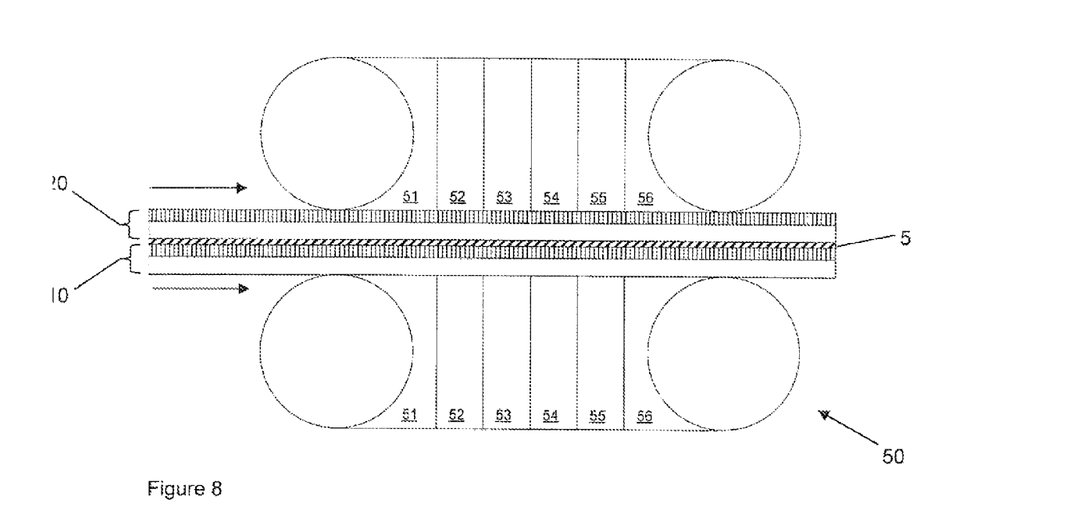
FIG. 8 is a schematic diagram of an isobaric press according to an embodiment of the invention.

In step (i) the assembled first and second substrate 10, 20 are subsequently pressed and laminated together by passing them through a double belt press 50, as illustrated in FIG. 8. It will be appreciated that the topology of the conducting layer 2 of the first substrate 10 is not depicted in FIG. 8 for simplicity. By way of example, a double belt press is described in U.S. Pat. No. 4,485,733.

It will be appreciated that double belt presses can be configured with multiple regions which are configured to apply pressure and temperature at different levels, and by different mechanisms. Double belt presses can be configured to include isobaric regions in which a substantially constant, predetermined pressure and temperature is applied between the two belts. Double belt presses can also be configured to include isochoric regions in which pressure is substantially dependant on layer thickness. Double belt presses with isochoric regions may for instance include circulating rollers, fixed rollers and sliding shoes. Double belt presses with isobaric regions may for instance include an oil filled pressurised region which exerts pressure and heat through the adjacent belt. It will be appreciated that a double belt press may include both isochoric and isobaric regions.

The assembled first substrate 10, bondlayer 5, and second substrate 20 are fed through the press 50 in a continuous process which reflows and cures the bondlayer 5, thereby laminating the first and second substrate 10, 20 together.

According to an embodiment, the double belt press comprises a number of isobaric regions 51 to 56 each of which are each arranged to exert a specific pressure and temperature. The dimensions and number of these regions, their specific pressures and temperatures and the speed of movement of the belt defines the environment or the lamination profile that the multilayer circuit experiences as it moves through the press. It will be appreciated that the optimal pressures and temperatures of the regions and the speed of movement of the belt will vary for different multilayer designs and for different bondfilms.

In one particular embodiment, regions 51 to 56 may be arranged to apply the same specific pressure, with regions 51 to 55 arranged to apply a first temperature and, region 56 arranged to exert a second temperature. The first temperature may be in excess of 150° C. The second temperature may be lower than the first temperature. The second temperature may be lower than 100° C. The specific pressure may be between 5 and 100 bar. The specific pressure may be in excess of 20 bar.

The total lamination cycle may be approximately 110 minutes.

Using a double belt press 50 allows first and second substrates 10, 20 of arbitrary length to be laminated together. The double belt press 50 allows a long lamination cycle to be used, during which a substantially uniform pressure and temperature is applied for a long period of time. In contrast lamination processes using hot rollers provide a varying pressure as the laminate passes through the roller, and are limited in the maximum duration of the lamination cycle.

As an alternative to aligning and fixing the first and second substrate 10, 20 together prior to pressing, an automatic alignment system may be provided on entry to the press, similar to that described in US 2001/0018796. The first and second substrate 10, 20 may thereby be continuously aligned as they are presented to the press, avoiding the need for pre-alignment and welding together of the two substrates 10, 20.

In steps (j) and (k) the laminated first and second substrate 10, 20, may subsequently be processed to pattern the metal layer 7 of the second substrate 20, using the same steps described above for patterning the metal layer 2 of the first substrate 10.

Alternatively, rather than laminating the substrate 20 prior to patterning, the second substrate 20 be patterned prior to laminating the first substrate 10 and second substrate 20.

It will be appreciated that the process described above can be used to pattern and combine and arbitrary number of substrates, each comprising a conductor and insulator. It will further be appreciated that double sided substrates comprising a patterned conductor layer on either side of an insulator layer can be included in the completed flexible PCB by patterning the conductor layer on each side of the insulator layer (for instance by using the patterning steps described above), then combining the substrates by placing a bondfilm therebetween and using the pressing process, as described above. It will similarly be appreciated that not all the metal layers of the flexible PCB must be patterned. An un-patterned metal layer may be appropriate in some applications, for instance as electromagnetic shielding and/or as a ground plane.

In step (l), a cover layer is applied to the exposed outer metal surface.

Having laminated together at least two substrates 10, 20, the laminated substrate is drilled in step (m) to provide access to the conducting layers, and laser ablated in step (n), for instance to provide access to buried conductors around connector holes. Conducting vias between conducting layers may be provided, for instance by a plating process (not shown).

Finally, the profile of the flexible printed circuit board may be formed, for instance by a routing process.

Figure 4:
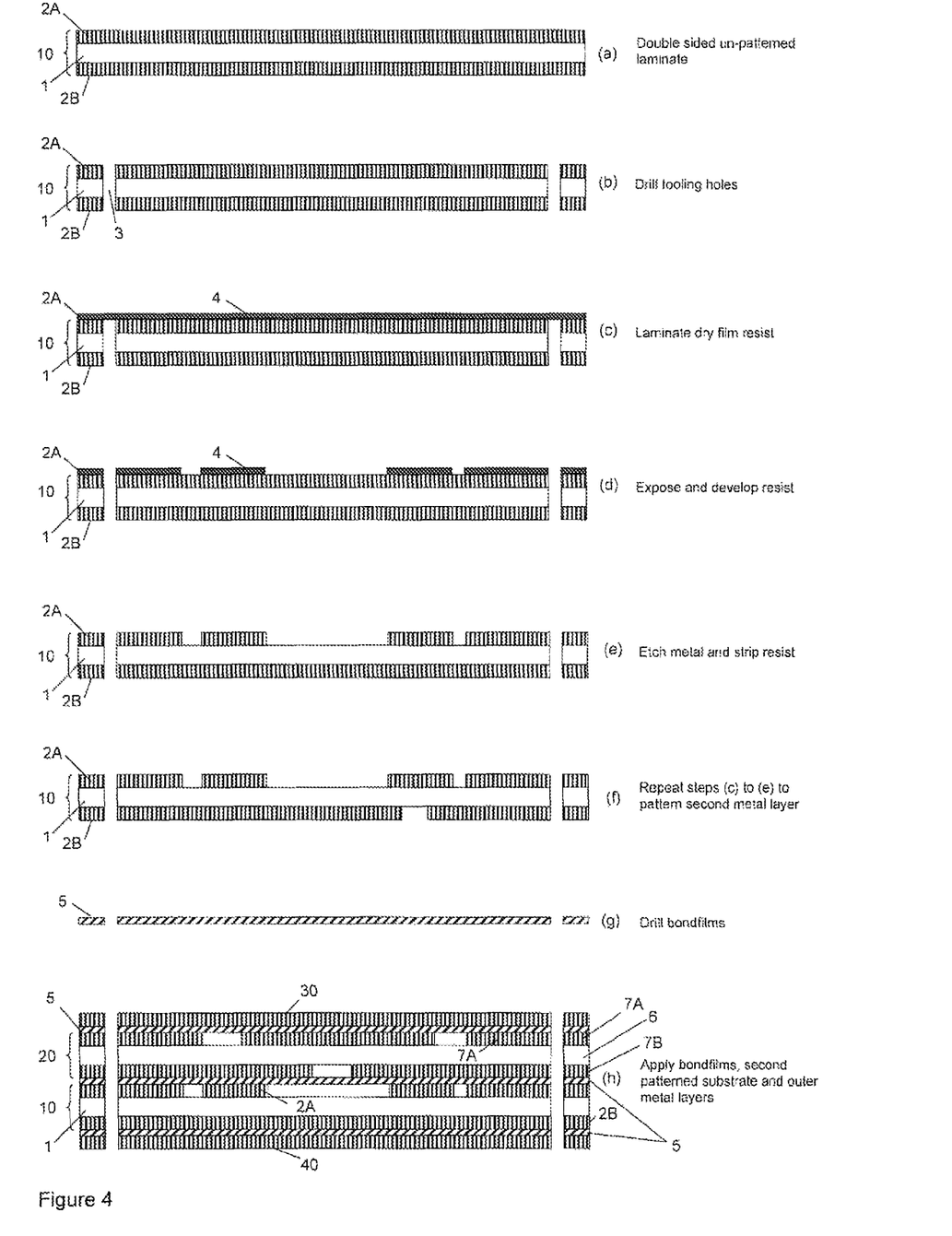
FIG. 4 shows a first subset of process steps (a) to (h) according to a second embodiment of the invention.
Figure 5:
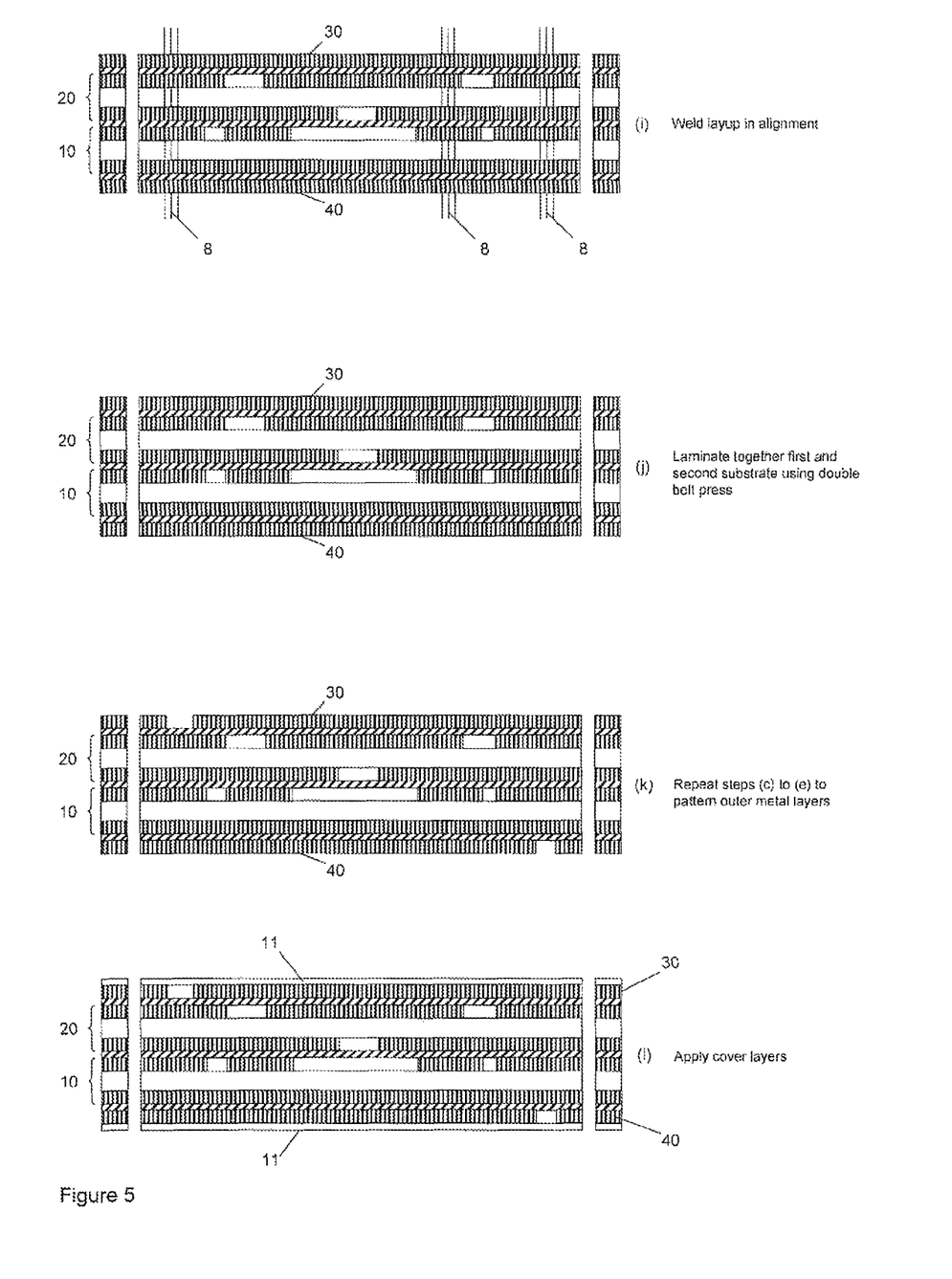
FIG. 5 shows a second subset of process steps (i) to (l) according to a second embodiment of the invention.
Figure 6:
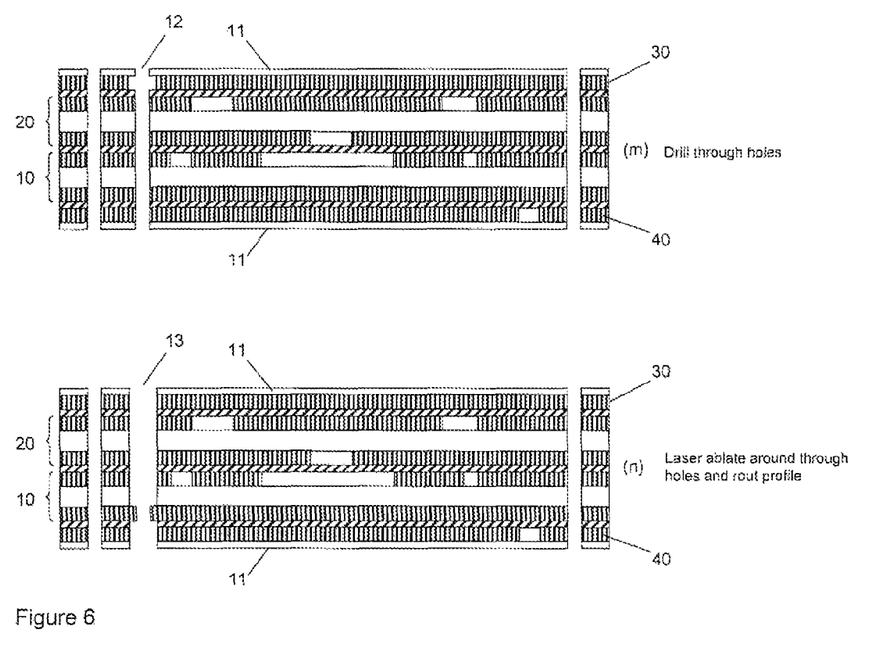
FIG. 6 shows a third subset of process steps (m) to (n) according to a second embodiment of the invention.

According to a second embodiment, an alternative process by which multi-layer flexible PCBs of arbitrary length may be produced is summarised by the following process steps (a) to (n), which will be described with reference to FIGS. 4 to 6.

The process begins (a) with a first pre-laminated substrate 10 of the appropriate length comprising a continuous, un-patterned insulator layer 1 with a continuous, un-patterned metal conductor layer 2A, 2B on each side thereof. Such double-sided substrates 10 are well known and are essentially unlimited in length.

In the next step (b) alignment holes 3 are drilled in substrate 10, which are used for alignment of subsequent process steps. The first substrate 10 is subsequently cleaned using a horizontal continuous, conveyorised process which is suitable for any length of substrate 10.

In step (c), dry film photosensitive resist 4 is laminated onto the metal layer 2A using a horizontal continuous, conveyorised process, which can accommodate any length of substrate 10. The resist 4 is subsequently patterned by exposing it to a pattern of light as described hereinbefore, and developing the resist (step (d)).

In the next step (e), the exposed resist 4 is developed, the underlying metal 2A is etched in a corresponding pattern, and the resist 4 is stripped, using a horizontal continuous process (suitable for substrates of arbitrary length).

In step (f), previous steps (c) to (e) are repeated to pattern the second metal layer 2B of the first substrate 10.

In an alternative arrangement, both the exposing and developing step (d) and the metal patterning step (e) may be carried out on both sides of the substrate 10 at the same time, thereby patterning metal layers 2A and 2B at the same time.

In step (g), three bondfilms 5 with substantially the same extents as the substrate 10 are drilled or otherwise patterned with through holes corresponding with the alignment holes 3.

A second substrate 20 and outer metal layers 30, 40 are provided of substantially the same size as the first substrate 10. The second substrate 20 comprises an un-patterned, continuous insulating layer 6 with patterned metal layers 7A and 7B on either side. The metal layers 7A and 7B may be patterned using the processes described hereinbefore.

In step (h) the first and second substrate 10, 20 and the outer metal layers 30, 40 are layered up in alignment in a stack, with the bondfilms 5 therebetween, thereby producing an arrangement of (from bottom to top) outer metal 40, bondfilm 5, first substrate 10, bondfilm 5, second substrate 20, bondfilm 5 and outer metal 30.

Any of the alignment methods described hereinbefore may be used to align the layers during step (h) as they are combined.

It will be appreciated that an arbitrary number of patterned or un-patterned single-sided or double-sided substrates may be combined in this way, comprising a stack of n substrates separated by bondfilms, with a further outermost bondfilm and metal layers on each side completing the stack.

In step (i) the layer stack 40, 5, 10, 5, 20, 5, 30 is fixed together in alignment by any of the methods described hereinbefore.

In step (j) the assembled layer stack 40, 5, 10, 5, 20, 5, 30 is subsequently pressed and laminated together to form a laminated substrate by passing them through a double belt press 50, as described hereinbefore.

In step (k), steps (c) to (e) are repeated to pattern the outer metal layers 30, 40 using any of the methods described hereinbefore. Cover layers 11 may subsequently be applied in step (l).

The laminated substrate is drilled in step (m) to provide access to the conducting layers, and laser ablated in step (n), for instance to provide access to buried conductors around connector holes. Conducting vias between conducting layers may be provided, for instance by a plating process (not shown).

Finally, the profile of the flexible printed circuit board may be formed, for instance by a routing process.

A number of other modifications and alterations may be made to the arrangements described herein without departing from the scope of the invention, as defined in the appended claims.

The process described herein differs from conventional fixed press processes for manufacturing multi-layer flexible PCBs in that it is continuous, and therefore is suitable for manufacturing multi-layer flexible PCBs of arbitrary length, for instance over 5 m in length.

In a conventional multi-layer layup in a static press, individual layers may be pinned together using tooling pins and tooling holes, the tooling pins being accommodated in bushes within the press plates during pressing. US 2001/0018796 discusses methods by which such tooling pins may be accommodated in a hot roller press. The approach disclosed herein of fixing the first substrate to the second substrate removes the need for tooling pins during the pressing process, and thereby overcomes a significant obstacle to successful continuous processing of multi-layer flexible PCBs.

The process disclosed herein is further advantageous over existing continuous processes for single sided, single layer flexible PCB manufacture, in that it facilitates multi-layer flexible PCBs of arbitrary length to be produced. Such multi-layer flexible PCBs provide a number of advantages over single layer or double-sided PCBs, for instance increased density of conducting tracks facilitating smaller PCBs and improved shielding and current carrying capacity.

Although hot roller press lamination is a well understood and widely used technology, it is used for laminating multiple films/fabrics/tapes which each have a constant thickness across the roller. Hot roller press lamination is not appropriate for lamination of films or substrates in which the thickness of any of the layers varies across the width of the roller, and/or layers which comprise multiple separate regions. In lamination of flexible PCBs, patterned conductor layers are not of constant thickness, having topology arising from circuit details, and hot roller press lamination therefore is not suitable for lamination of multi-layer flexible PCBs. Roll to roll contact provides only a narrow peak of temperature and pressure, which is not suitable for laminating films or substrates with topology.

Double belt presses were developed to laminate layers of substantially constant thickness, for instance to make flooring material by applying a substantially uniform pressure during continuous pressing. The present applicant has identified that a double belt press allows substrates of non-uniform thickness to be successfully laminated together in a continuous process. A double belt press allows for long pressing durations, and it has been found by the present applicant that such a process can achieve the same pressing performance as a fixed press in laminating multi-layer PCBs. Although a specific embodiment with an isobaric double belt presses has been described, the present invention is not so restricted, and double belt presses with isochoric regions are contemplated in alternative embodiments.

The process described herein is suitable for producing flexible PCBs with multiple discontinuous patterned metal layers of arbitrary length. The process allows patterned flexible substrates to be laminated together using a continuous process which can accommodate substrates of unlimited length.

Furthermore, several alternative methods by which a resist layer can be patterned have been disclosed, including arrangements which are suitable for continuously patterning resist over an unlimited length of substrate.

The invention claimed is:

1. A method of manufacturing a multilayer flexible circuit, comprising:
   providing first and second flexible substrates, each comprising a conductor layer and an insulator layer, the conductor layer of the first substrate being a patterned conductor layer;
   fixing together the first and second substrates;
   laminating the fixed first and second substrates together using a double belt press through which the substrates move in a continuous process; and
   patterning the conductor layer of the first substrate, the second substrate, or the first substrate and the second substrateby:
      laminating a resist onto the conductor layer;
      exposing the resist to a pattern, wherein exposing comprises carrying out a plurality of exposures over adjacent areas of the resist layer, which adjacent exposures together define a single circuit;
      developing the resist;
      etching the conductor layer, thereby patterning it in correspondence to the developed resist; and
      stripping the resist layer.

2. The method of claim 1, wherein the double belt press includes an isobaric region.

3. The method of claim 1, wherein the double belt press includes an isochoric region.

4. The method of claim 1, wherein the first substrate is provided with alignment features which are used for subsequent alignment of another layer, substrate and/or subsequent process.

5. The method of claim 4, wherein the alignment features comprise through holes.

6. The method of claim 4, wherein the alignment features are provided at either end of the first substrate.

7. The method of claim 4, wherein the alignment features are provided at regular intervals along the length of the substrate.

8. The method of claim 1, further comprising the step of aligning the first and second substrates prior to laminating them together.

9. The method of claim 8, wherein the first substrate is provided with alignment features which are used for subsequent alignment of another layer, substrate and/or subsequent process, and wherein aligning comprises using the alignment features.

10. The method of claim 1, wherein fixing comprises locally welding the first substrate to the second substrate.

11. The method of claim 1, wherein an outer conductor layer is arranged with the first and second substrate and subsequently laminated together with them, to form an outer conductor layer of the flexible circuit.

12. The method of claim 1, wherein exposing comprises using laser direct imaging.

13. The method of claim 12, comprising moving the substrate under a stationary laser direct imaging device to expose the resist in a continuous process.

14. The method of claim 13, wherein the substrate is moved in a stepwise manner under a laser direct imaging device to expose the resist.

15. The method of claim 12, wherein a laser direct imaging device is moved over a stationary substrate.

16. The method of claim 1, wherein alignment features are patterned in the conductor layer.

17. The method of claim 16, wherein the alignment features in the conductor layer are used in aligning patterning of a subsequent conductor layer.

18. The method of claim 1, wherein the patterned conductor layer comprises a plurality of separate regions of conductor.

19. The method of claim 1, wherein the patterned conductor layer is at least one of: discontinuous; irregular; and not self supporting.

20. The method of claim 1, wherein the patterned conductor layer is arranged to form a circuit.

21. The method of claim 1, wherein each part of the substrate is subjected to a predetermined cycle of heat and pressure during lamination.

22. The method of claim 21, wherein the cycle has a duration of at least 10 minutes.

23. The method of claim 22, wherein the cycle has a duration of at least 1 hour.

24. The method of claim 21, wherein the press comprises a plurality of regions, each region imparting a predetermined temperature and/or pressure to the substrate during lamination.

25. The method of claim 21, wherein a central region of the press imparts a temperature and pressure that is higher than that imparted by a region adjacent to the entrance of the press, and/or higher than that imparted by a region adjacent to the exit of the press.

26. The method of claim 1, wherein the conductor layer of the second substrate is patterned prior to laminating the first and second substrate together.

27. The method of claim 1, wherein the conductor layer of the second substrate is patterned after laminating the first and second substrate together.

28. The method of claim 11, wherein the outer conductor layer is patterned after laminating the first and second substrate together.

29. The method of claim 1, wherein the first and/or second substrate comprises a plurality of conducting layers.

30. The method of claim 1, wherein the first and/or second substrate comprise double sided substrates, each double sided substrate comprising a first and second conducting layer, with an insulating layer there between.

31. The method of claim 1, wherein at least three substrates are laminated together.

32. The method of claim 1, wherein a bondfilm is disposed between adjacent substrates and/or layers before laminating them together.

33. The method of claim 11, wherein the outer conductor layer is patterned after it is laminated together with the first and second substrate.

34. The method of claim 1, wherein the step of exposing the resist to a pattern, comprises aligning individual photomasks over each adjacent area of the resist layer, and exposing the aligned individual photomasks so as to expose a composite pattern that is longer than the pattern of each photomask.

* * * * *